US010953539B2

(12) United States Patent
Yoshida et al.

(10) Patent No.: US 10,953,539 B2
(45) Date of Patent: Mar. 23, 2021

(54) SUBSTRATE TRANSFER ROBOT AND AUTOMATIC TEACHING METHOD

(71) Applicants: KAWASAKI JUKOGYO KABUSHIKI KAISHA, Kobe (JP); KAWASAKI ROBOTICS (USA), INC., Wixom, MI (US)

(72) Inventors: Masaya Yoshida, Himeji (JP); Hajime Nakahara, San Jose, CA (US); Mark Tang, San Ramon, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 182 days.

(21) Appl. No.: 16/233,314

(22) Filed: Dec. 27, 2018

(65) Prior Publication Data
US 2020/0206917 A1 Jul. 2, 2020

(51) Int. Cl.
B25J 9/16 (2006.01)
H01L 21/67 (2006.01)
H01L 21/68 (2006.01)
H01L 21/677 (2006.01)
H01L 21/687 (2006.01)
B65G 47/90 (2006.01)
G05B 19/425 (2006.01)

(52) U.S. Cl.
CPC ............. B25J 9/163 (2013.01); B25J 9/1692 (2013.01); B25J 9/1694 (2013.01); B65G 47/905 (2013.01); G05B 19/425 (2013.01); H01L 21/67259 (2013.01); H01L 21/68707 (2013.01); B65G 2203/044 (2013.01)

(58) Field of Classification Search
CPC ........................... H01L 21/67259; B25J 9/163
See application file for complete search history.

(56) References Cited

U.S. PATENT DOCUMENTS 8,688,261 B2 * 4/2014 Hirota ............... H01L 21/67265
700/213
2005/0034288 A1 2/2005 Adachi et al.
2005/0201424 A1 9/2005 Yoshida et al.
2007/0273892 A1 * 11/2007 Asari ................ H01L 21/67781
356/614
2011/0130864 A1 * 6/2011 Hirota .................... G05B 19/42
700/213
2012/0290124 A1 * 11/2012 Kimura ............ H01L 21/67265
700/218
(Continued)

FOREIGN PATENT DOCUMENTS

JP 2005-260176 A 9/2005
JP 2005-277175 A 10/2005
(Continued)

Primary Examiner — Thomas Randazzo
(74) Attorney, Agent, or Firm — Oliff PLC

(57) ABSTRACT

A substrate transfer robot, first and second sensors are provided in a hand such that a planar-view intersection point of optical axes is located on a center of a substrate when the hand holds the substrate in planar view, and a control device operates an arm, scans a target placed at a teaching position with the first and second sensors, and acquires the teaching position when the target is located at the planar-view intersection point of the optical axes.

5 Claims, 10 Drawing Sheets

(56) References Cited

U.S. PATENT DOCUMENTS

| | | | |
|---|---|---|---|
| 2016/0055425 A1* | 2/2016 | Minami | G05B 19/425 |
| | | | 706/12 |
| 2016/0158935 A1 | 6/2016 | Inomata et al. | |
| 2016/0240412 A1* | 8/2016 | Kodama | G01V 8/20 |
| 2016/0240420 A1* | 8/2016 | Wagenleitner | H01L 21/6838 |
| 2019/0181027 A1 | 6/2019 | Yoshida et al. | |

FOREIGN PATENT DOCUMENTS

| | | |
|---|---|---|
| JP | 2010-284728 A | 12/2010 |
| TW | 201735225 A | 10/2017 |
| WO | 03/022534 A1 | 3/2003 |

\* cited by examiner

SUBSTRATE TRANSFER ROBOT AND AUTOMATIC TEACHING METHOD

BACKGROUND OF THE INVENTION

1. Field of the Invention

The present invention relates to a substrate transfer robot and a method of automatically teaching a teaching position to the substrate transport robot.

2. Description of the Related Art

As disclosed in U. S. Patent Application No. 2016/0158935 A1, when a position of a substrate is automatically taught to the substrate transfer robot, a jig disposed at the teaching position is scanned with a sensor provided on a hand.

When the teaching position is acquired, the hand is moved to the teaching position, and work to place the substrate at the teaching position is performed. In order to secure the placement of the substrate, there is a demand for improving positional accuracy of the teaching position.

SUMMARY OF THE INVENTION

An object of the present invention is to improve the positional accuracy of the teaching position.

According to one aspect of the present invention, a substrate transfer robot includes: an arm having a degree of freedom in at least two horizontal axis directions; a hand including a base end connected to a front end of the arm and a first front end and a second front end that are bifurcated from the base end, a substrate being able to be held on an upper surface side of the hand; first and second sensors that emit detection light in a space between the first front end and the second front end and are arranged such that optical axes of the first and second sensors intersect each other within the space in planar view; and a control device that controls operation of the arm and the hand. The first and second sensors are provided in the hand such that a planar-view intersection point of the optical axes is located on a predetermined position of the substrate when the substrate is held by the hand in planar view, and the control device operates the arm, scans the target placed at a teaching position with the first and second sensors, and acquires the teaching position when the target is located at the planar-view intersection point of the optical axes.

With this configuration, the position of the substrate is easily set as the teaching position when the hand holds the substrate by intersecting the detection light beams of two systems, so that the substrate is surely placed using the teaching position.

DETAILED DESCRIPTION OF PREFERRED EMBODIMENTS

Figure 1:
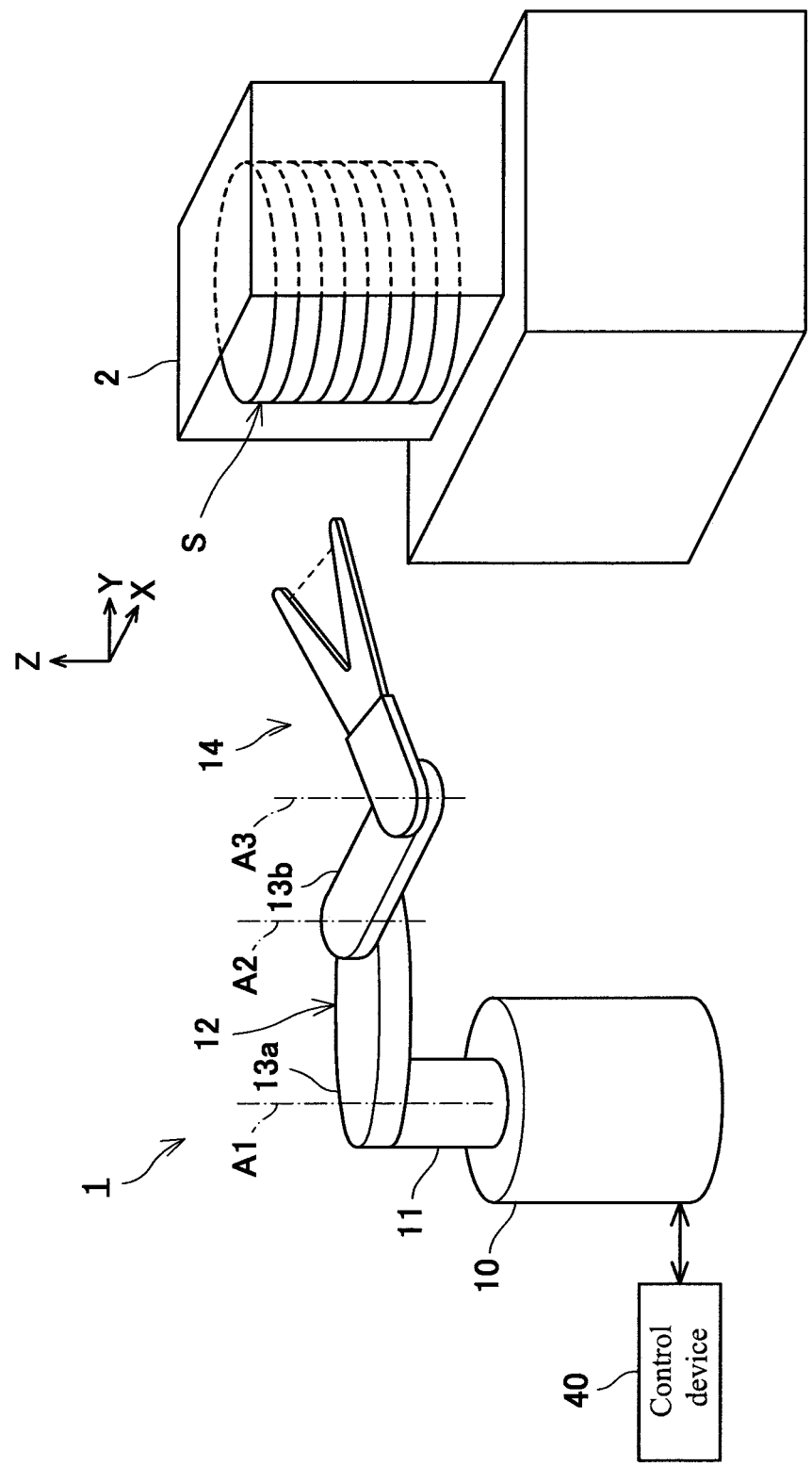
FIG. 1 is a conceptual diagram illustrating a robot according to a first embodiment.

Embodiments will be described below with reference to the drawings. Identical or corresponding elements are denoted by the same reference numerals throughout the drawings, and overlapping description is omitted.

FIG. 1 illustrates a robot 1. The robot 1 can be used to transfer a substrate S in a semiconductor processing facility that manufactures a semiconductor element. The substrate S is a material of a semiconductor element called a wafer, and is formed in a disk shape. A plurality of processing apparatuses are installed in the semiconductor processing facility in order to perform various treatments such as heat treatment, impurity introduction treatment, thin film formation treatment, lithography treatment, cleaning treatment, and flattening treatment, on the substrate S.

For example, the robot 1 transfers the substrate S accommodated in the cassette 2 to the processing device. For example, the cassette 2 is a Front-Opening Unified Pod (FOUP). Although the single cassette 2 is illustrated, an EFEM (Equipment Front End Module) intensively including a plurality of (for example, two or three) cassettes 2 may be installed in the semiconductor processing facility. In this case, preferably the robot 1 is configured to be accessible in each cassette 2 without a travel device.

The robot 1 includes a base 10, an arm 12, a hand 14, a first sensor 20, a second sensor 30, and a control device 40.

The base 10 is fixed to a proper place (for example, a horizontal floor surface) of the semiconductor processing facility (or may be supported on a facility floor surface with the travel device interposed therebetween). Hereinafter, a direction will be described assuming that the base 10 is properly installed on the horizontal floor surface.

An arm 12 is connected to the base 10 with a lifting shaft 11 interposed therebetween. The lifting shaft 11 can move in a vertical direction (Z-direction) relative to the base 10, thereby vertically moving the arm 12 and a hand 14. The arm 12 is formed by connecting at least two links. The hand 14 is connected to the arm 12. The robot 1 or the arm 12 is what is called a horizontal articulated type, and the arm 12 has a degree of freedom in at least two horizontal axis directions (an X-direction and a Y-direction). In the robot 1, a plurality of rotation axes A1, A2, . . . are set so as to be oriented in parallel with each other in a plurality of connection portions. Any rotation axes A1, A2, . . . are also oriented in the vertical direction (Z-direction). "The plurality of connection portions" include a connection portion between the base 10 and the arm 12, a connection portion between two adjacent links among links constituting the arm 12, and a connection portion between the arm 12 and the hand 14. For example, in the first embodiment, the arm 12 includes two links of a first link 13a and a second link 13b, and three connection portions and three rotation axes are set in the robot 1.

A base end of the first link 13a is connected to the base 10 so as to be rotatable around the rotation axis A1. The base end of the second link 13b is connected to the front end of the first link 13a so as to be rotatable around the rotation axis A2. The hand 14 is connected to the front end portion of the second link 13b so as to be rotatable around the rotation axis A3. The links 13a, 13b and the hand 14 can swing in a horizontal plane (XY-plane). The hand 14 can move along any locus (including a straight line and a curved line) within a horizontal plane according to a posture of the arm 12 (a rotation angle around each of rotation axes A1 to A3).

Figure 2:
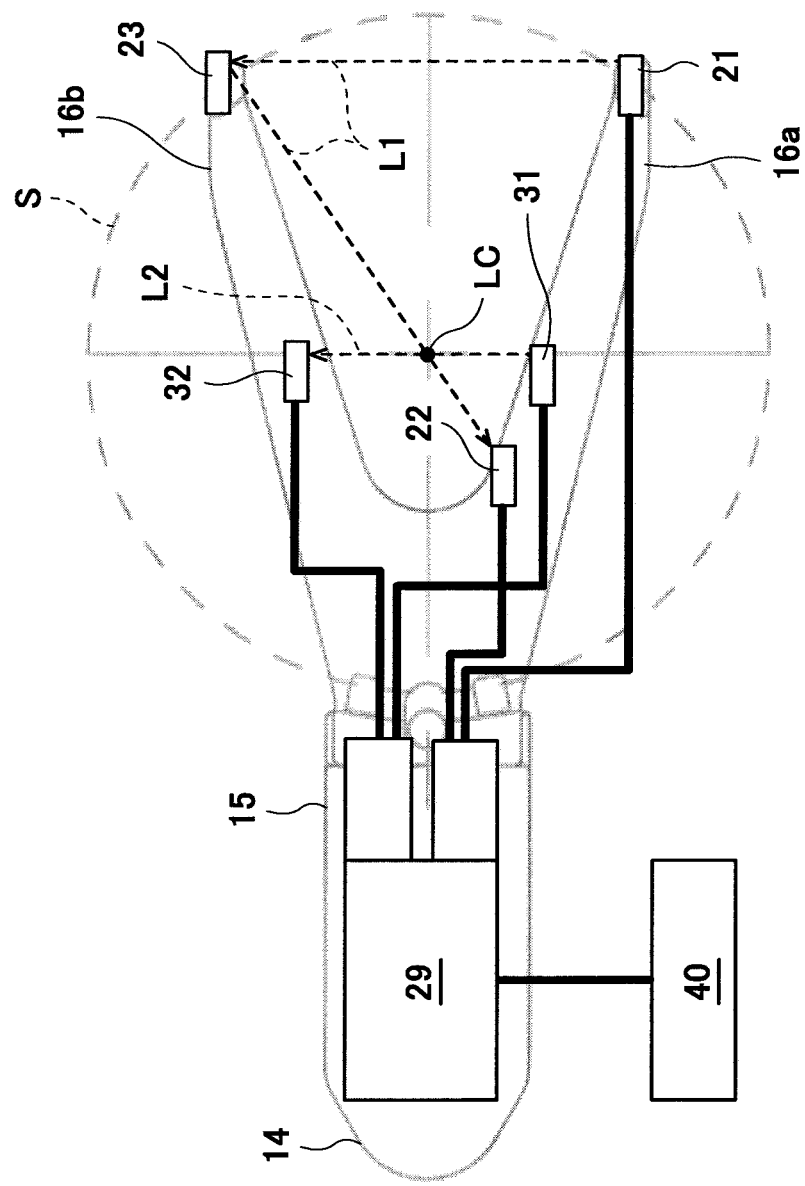
FIG. 2 is a plan view illustrating a hand according to the first embodiment.

FIG. 2 illustrates the hand 14. The hand 14 has a thin plate shape. The hand 14 extends horizontally from the front end of the arm 12. The hand 14 is configured so as to be able to hold a disk-shaped substrate S on its upper surface side, whereby the substrate S is kept in a substantially horizontal posture on the hand 14. A holding structure is not particularly limited, but an edge grip type or a suction type can be adopted. When the arm 12 and the hand 14 lift and/or swing while the hand 14 holds the substrate S, the robot 1 can transfer the substrate S along any trajectory in the X-, Y- and/or Z-direction while kept in a horizontal posture.

The hand 14 is formed into a U-shape in planar view. The hand 14 includes a single base end 15 and a first front end 16a and a second front end 16b that are bifurcated from the base end 15. The hand 14 is symmetrical with respect to a center line C in planar view. The base end 15 of the hand 14 is connected to the arm 12 such that the rotation axis A3 is located on the center line C.

The first and second sensors 20, 30 are an optical sensor, and form first and second detection lights L1, L2 propagating in a space between the first front end 16a and the second front end 16b of the hand 14. The detection light L has a beam shape, and is linearly formed in the space. The first and second sensors 20, 30 are a transmission type. The first sensor 20 includes a first light emitting element 21 and a first light receiving element 22, and the second sensor 30 includes a second light emitting element 31 and a second light receiving element 32. An amplifier 29 used for photoelectric conversion is interposed between the control device 40 and the elements 21, 22, 31, 32. The amplifier 29 is connected to the control device 40 through a harness so as to be able to transmit an electric signal, and connected to the elements 21, 22, 31, 32 through an optical fiber disposed in the hand 14 so as to be able to transmit an optical signal. In the first embodiment, the single amplifier 29 is shared by the first and second sensors 20, 30. The electric signal output from the control device 40 is converted into the optical signal by the amplifier 29, and the optical signal is led to the first and second light emitting elements 21, 31.

In the first embodiment, the first light receiving element 22 is disposed on an optical path of the first detection light L1 emitted from the first light emitting element 21. The second light receiving element 32 is also disposed on an optical path of the second detection light L2 emitted from the second light emitting element 31 (an example in which the second light receiving element 32 is not disposed will be described as a second embodiment).

The first detection light L1 and the second detection light L2 intersect each other at least in planar view. However, a deviation may exist in the vertical direction (an example in which the deviation exists will be described as the second embodiment). In this way, even if the deviation exists actually in the vertical direction, because an intersection point of the first detection light L1 and the second detection light L2 exists in planar view, the intersection point is referred to as "planar-view intersection point LC" for convenience. In description of the first embodiment, it is assumed that the first detection light L1 and the second detection light L2 are located at an identical position in the vertical direction, and that the first detection light L1 and the second detection light L2 actually intersect each other.

The planar-view intersection point LC is located at a center of the hand 14. The planar-view intersection point LC or the center of the hand 14 exists in the space between the first front end 16a and the second front end 16b. In other words, the planar-view intersection point LC is a position where a predetermined position of the disk-shaped substrate S should be disposed while the substrate S is held by the hand 14. As an example, the predetermined position is a center position of the substrate S.

The second light emitting element 31 and the second light receiving element 32 are disposed separately at the first front end 16a and the second front end 16b. The second light emitting element 31 and the second light receiving element 32 are opposed to each other in a direction orthogonal to the center line C while the center of the hand 14 is sandwiched between the second light emitting element 31 and the second light receiving element 32. In the first embodiment, the second detection light L2 emitted from the second light emitting element 31 is incident on the second light receiving element 32 unless anything blocks the second detection light L2.

The first detection light L1 propagates in a direction inclined with respect to the center line C, and therefore intersects the second detection light L2 formed as described above in planar view. In the first embodiment, a reflector 23 is interposed on the optical path between the first light emitting element 21 and the first light receiving element 22. As an example of this case, the first light emitting element 21 is attached to the first front end 16a on the front end side with respect to the second light emitting element 31 and the second light receiving element 32 (or the center of the hand 14). The first detection light L1 emitted from the first light emitting element 21 travels in the direction orthogonal to the center line C. The reflector 23 is opposed to the first light emitting element 21 in the direction orthogonal to the center line C, and attached to the second front end 16b. The first light receiving element 22 is attached to the first front end 16a similarly to the first light emitting element 21, and disposed on a base end side with respect to the center of the hand 14 in contrast with the first light emitting element 21. The first detection light L1 reflected by the reflector 23 is incident on the first light receiving element 22 through the center of the hand 14 in planar view. With this disposition, similarly to the conventional technique, after the detection light traveling in the direction orthogonal to the center line C is formed between the front ends of the whole of the hand 14, the planar-view intersection point LC of the first detection light L1 and the second detection light L2 can be formed in the center of the hand 14.

Figure 3:
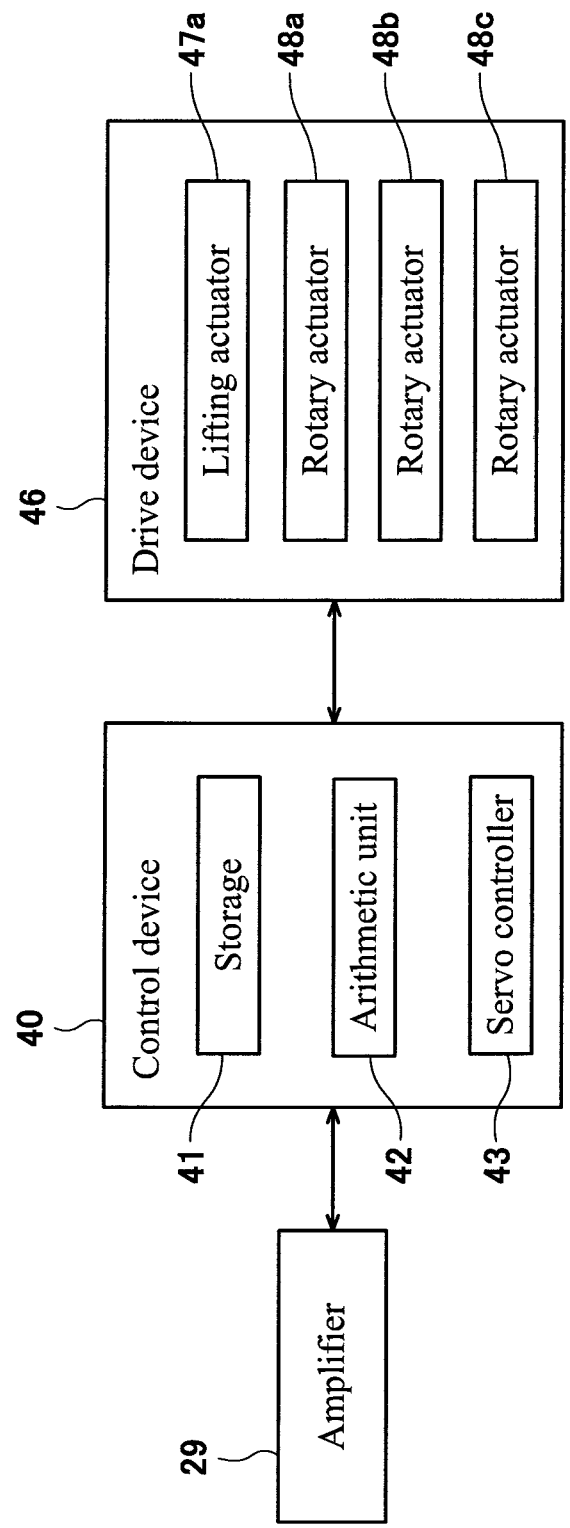
FIG. 3 is a block diagram illustrating a control system of the robot according to the first embodiment.

FIG. 3 illustrates a control system of the robot 1. The control device 40 controls operation of the arm 12 and the hand 14. The control device 40 is a robot controller including a computer such as a microcontroller. The control device 40 is not limited to a single device, but may be constructed with a plurality of devices.

The control device 40 includes a storage 41, an arithmetic unit 42, and a servo controller 43. The storage 41 stores information such as a basic program of the control device 40, an operation program of the robot 1, and data acquired during execution of the operation program.

The arithmetic unit 42 performs arithmetic processing for robot control, and generates a control command of the robot 1. The servo controller 43 controls a drive device 46 of the robot 1 based on the control command generated by the arithmetic unit 42. For example, the drive device 46 includes a lifting actuator 47a (for example, an electric motor that drives a ball screw) that lifts the lifting shaft 11 and a plurality of rotary actuators 48a, 48b, and 48c (for example, electric motors) corresponding to the rotation axes A1 to A3. The drive device 46 moves the hand 14 according to the control command from the control device 40. In the following description, a change in posture or position of the arm 12 or the hand 14 are performed through the control performed by the control device 40.

The operation program stored in the storage 41 includes not only a work program causing the robot 1 to automatically perform the work to transfer the substrate S in practical use in the semiconductor processing facility but also a program automatically teaching the teaching position to the robot 1 to perform the work to transfer the substrate S. The teaching position is a substrate placing stage provided on the cassette 2 or the processing device.

Figure 4A:
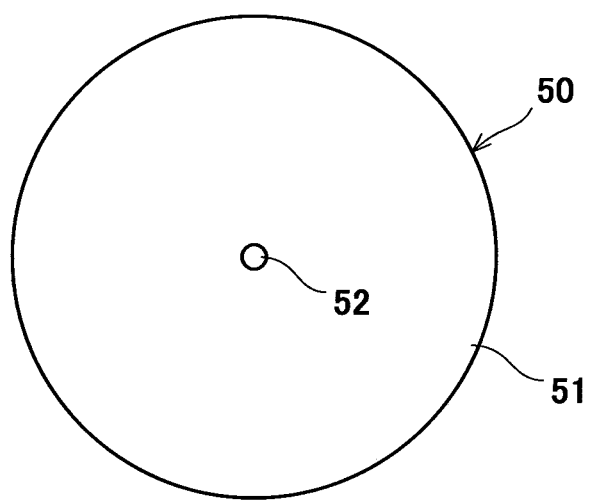
FIGS. 4A and 4B are views illustrating a jig according to the first embodiment.
Figure 4B:
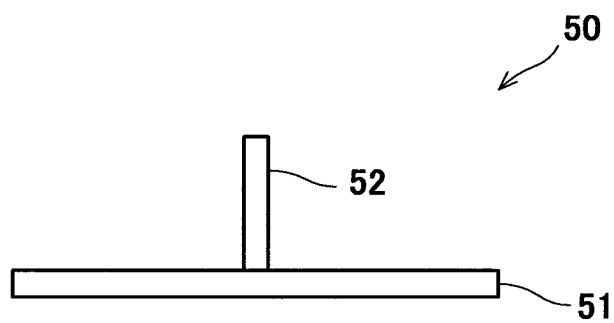

A jig 50 is used in the automatic teaching. As illustrated in FIG. 4, the jig 50 includes a disk unit 51 and a target 52 erected from the center of the disk unit 51. The disk unit 51 has a shape simulating the substrate S transferred by the hand 14. The target 52 is formed into a columnar shape extending perpendicularly from a surface of the disk unit 51, and sometimes referred to as a "pin". Because the teaching position is typically a stage as described above, the disk unit 51 is placed on the stage on which the teaching position is desired to be acquired similarly to the substrate S. The automatic teaching is started when a teaching operator appropriately inputs the execution of the automatic teaching program to the control device 40.

Figure 5:
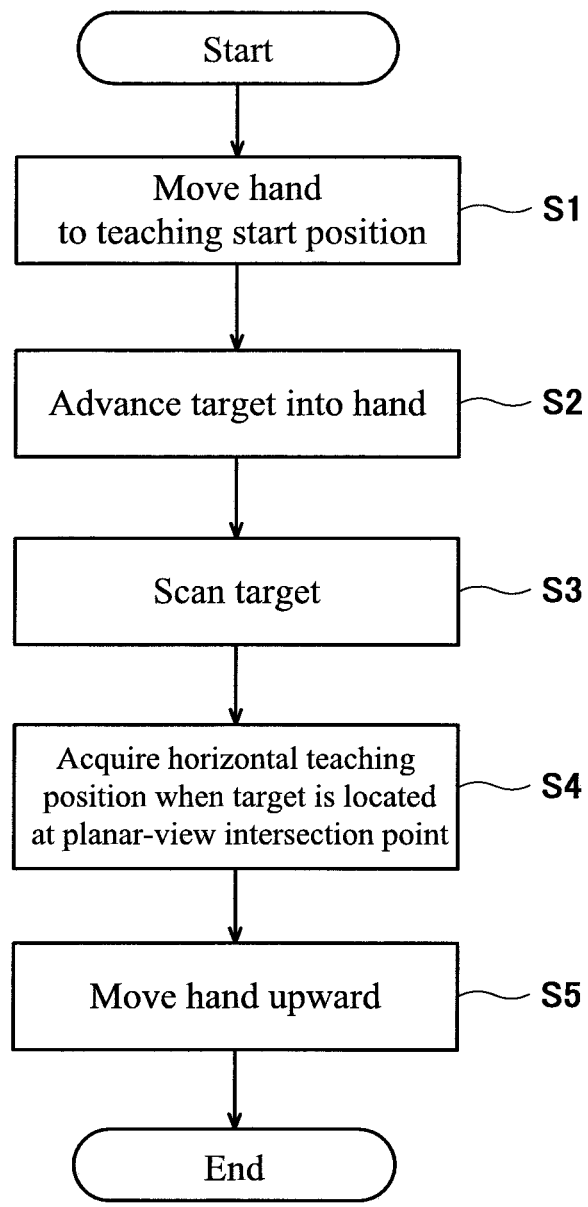
FIG. 5 is a flowchart illustrating a procedure of automatic teaching according to the first embodiment.
Figure 6C:
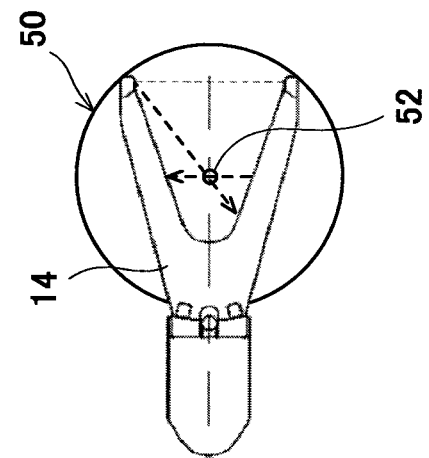
FIGS. 6A to 6C are explanatory views illustrating automatic teaching according to the first embodiment.
Figure 6B:
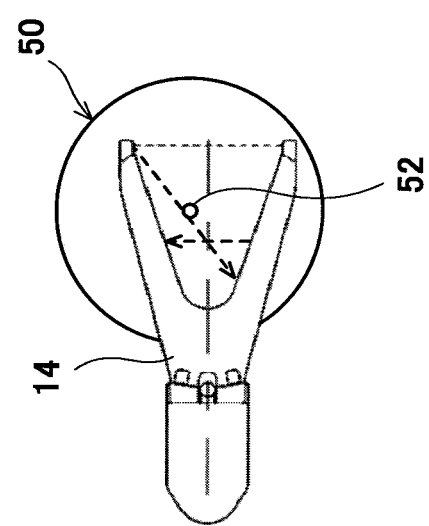
Figure 6A:
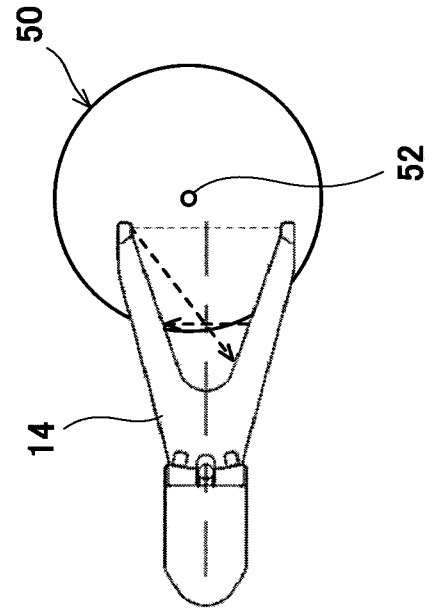

Referring to FIG. 5, the hand 14 is moved to a teaching start position near the teaching position (S1, see FIG. 6A). At the teaching start position, the hand 14 is located above the disk unit 51 and below an upper end of the target 52. The hand 14 is moved such that the target 52 enters the space between the first front end 16a and the second front end 16b (S2, see FIG. 6B), the target is scanned with the first detection light L1 and the second detection light L2 of the first and second sensors 20, 30 (S3, see FIG. 6B), and the teaching position is acquired when the target 52 is located at the planar-view intersection point of the first detection light L1 and the second detection light L2 (S4, see FIG. 6C).

The operation direction of the hand 14 during the scanning is not particularly limited. As an example, the hand 14 is moved in the direction of the center line C. The first detection light L1 is blocked by the target 52, the first light receiving element 22 cannot receive the light, and the electric signal (ON signal) indicating that the light is not received is transmitted from the amplifier 29 to the control device 40. When the target 52 is located on the center line C, the hand 14 is advanced as it is, whereby the target 52 reaches the planar-view intersection point (the center of the hand 14). Both the first detection light L1 and the second detection light L2 are blocked by the target 52, so that neither the first light receiving element 22 nor the second light receiving element 32 can receive the light. When the target 52 deviates in the direction orthogonal to the center line C from the center line C, one of the first detection light L1 and the second detection light L2 is blocked. When the target 52 deviates onto an upper side of a paper surface, the first detection light L1 is blocked. How much the target 52 deviates onto the upper side of the paper surface can be known from a relationship between a distance from the position where the first detection light L1 is initially blocked to the position where the first detection light L1 is blocked again and a distance from the position where the first detection light L1 is initially blocked to the center of the hand 14. Thus, the hand 14 is further moved in the direction of the center line C while moved onto the lower side of the paper surface based on this deviation amount, which allows the target 52 to be located at the planar-view intersection point. On the other hand, when the target 52 deviates onto the lower side of the paper surface, the second detection light L2 is blocked. In this case, the target 52 can be located at the planar-view intersection point by moving the hand 14 onto the lower side of the paper surface.

Finally, the hand 14 is moved upward (S5). When the first detection light L1 and the second detection light L2 are located above the upper end of the target 52, both the first light receiving element 22 and the second light receiving element 32 can receive the corresponding detection light, and the electric signal (OFF signal) indicating that the light can be received is output to the control device 40. Based on the vertical position of the hand 14 at this time, the teaching position relating to the vertical direction is also acquired.

In this way, in the first embodiment, the first detection light L1 and the second detection light L2 are formed so as to pass through a predetermined position of the substrate S while the substrate S is held by the hand 14, and the planar-view intersection point of the first detection light L1 and the second detection light L2 is acquired as the teaching position. Because the predetermined position of the substrate is directly acquired as the teaching position, the substrate S is surely placed when actually placed on the hand 14 from the stage set as the teaching position. Particularly, in the first embodiment, the predetermined position is the center position of the substrate. The center of the hand 14 is matched with the center position of the substrate at the time of holding the substrate. Consequently, the center of the hand 14 or the substrate center is directly acquired as the teaching position, which is advantageous.

Figure 7:
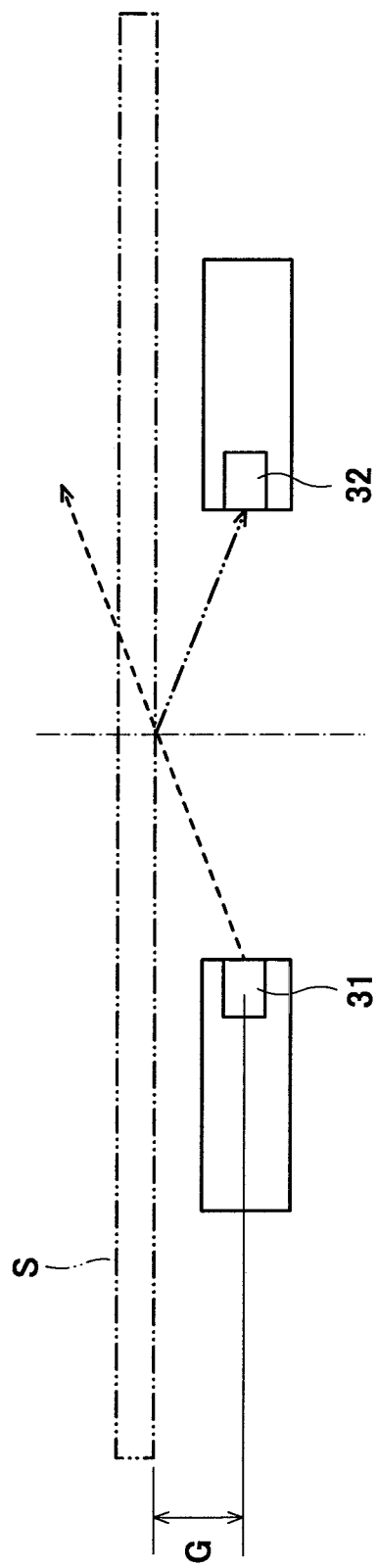
FIG. 7 is a view illustrating a second sensor according to a second embodiment.

A second embodiment will be described below. The planar-view disposition of the elements 21, 22, 31, 32 and the optical paths of the first detection light L1 and the second detection light L2 in plan view are identical to those of the first embodiment (see FIG. 2). However, as illustrated in FIG. 7, the second light emitting element 31 emits the second detection light L2 in an oblique direction having a vertically upward component. Unless the substrate S is placed on the hand 14, the first detection light L1 passes above the second front end 16b, and the second light receiving element 32 cannot receive the second detection light L2 (see an arrow indicated by a dotted line). In the case that the substrate S is placed on the hand 14, the second detection light L2 is reflected by the lower surface of the substrate S. Thus, the second light receiving element 32 receives the second detection light L2 (see an arrow indicated by a two-dot chain line). That is, the second sensor 30 acts as a sensor that detects whether the substrate exists in the hand 14 during the substrate transfer operation. In the case that the substrate S is placed on the hand 14, a gap G between the second light emitting element 31 and the second light receiving element 32 and the lower surface of the substrate S is substantially kept constant. The second light emitting element 31 and the second light receiving element 32 are symmetrically disposed with respect to the center line C, and disposed at the identical position in the vertical direction. Thus, the second detection light L2 is reflected at the center of the lower surface of the substrate S, and is incident on the second light receiving element 32.

Figure 8A:
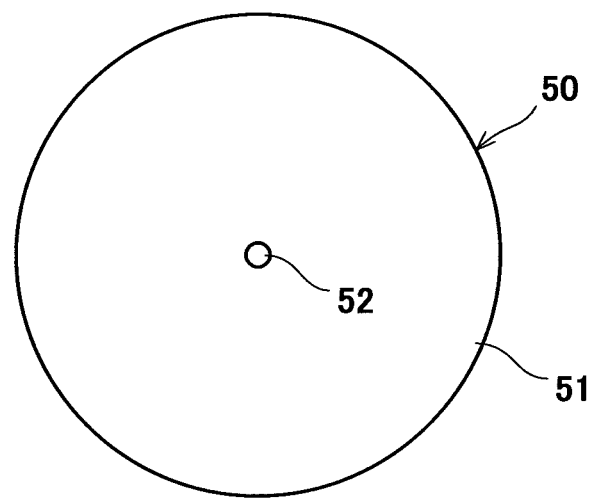
FIGS. 8A and 8B are views illustrating a jig according to the second embodiment.
Figure 8B:
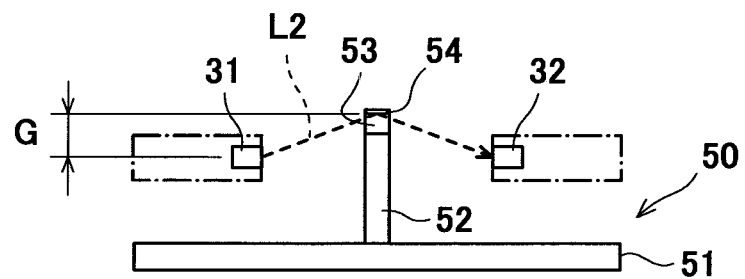

As illustrated in FIGS. 8A and 8B, in order to perform the automatic teaching using the second sensor 30, a light transmission window 53 and a reflector 54 are provided at a predetermined portion (for example, the upper end) of the target 52 of the jig 50.

Even in the automatic teaching in the second embodiment, the jig 50 is installed on the stage where the teaching position is desired to be acquired prior to the execution of the teaching program. Then, the hand 14 is operated in the vicinity of the jig 50. The jig 50 is previously installed while the light transmission window 53 is open in the direction orthogonal to the center line C of the hand 14 during the operation of the hand 14.

Figure 9:
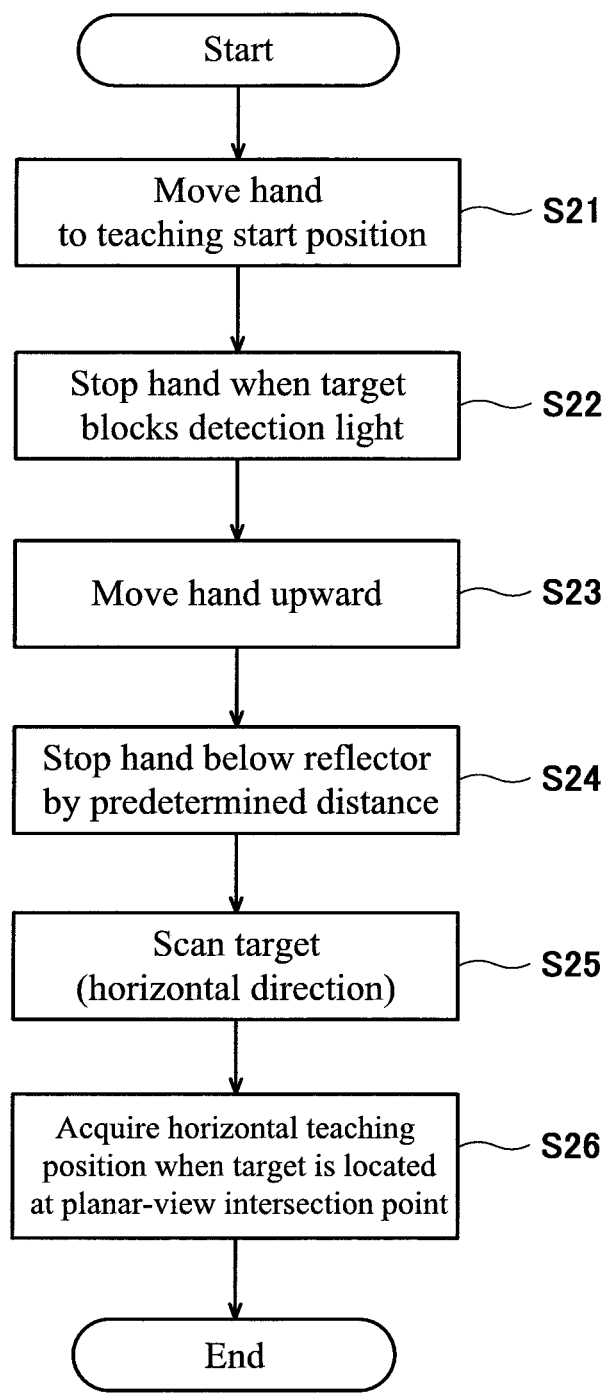
FIG. 9 is a flowchart illustrating a procedure of automatic teaching according to the second embodiment.
Figure 10A:
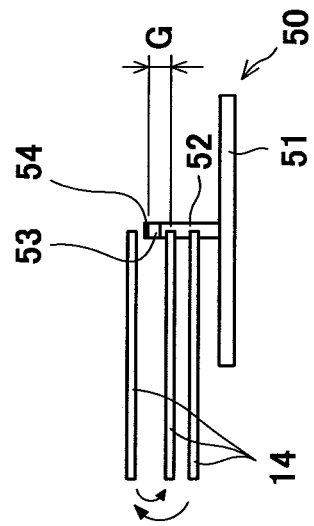
FIGS. 10A to 10D are explanatory views illustrating automatic teaching according to the second embodiment.
Figure 10C:
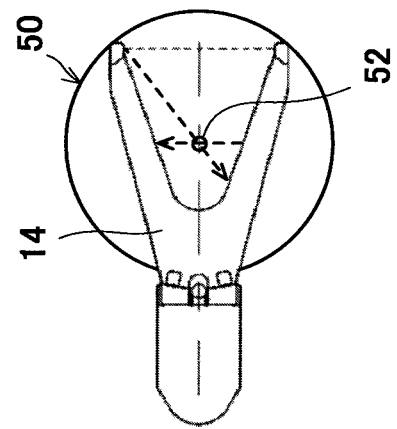
Figure 10B:
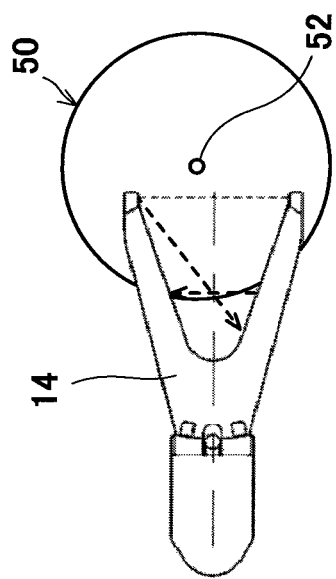

Referring to FIG. 9, when the automatic teaching starts, the hand 14 is moved to the teaching start position near the teaching position (S21, see FIG. 10A). Subsequently, the hand 14 is moved such that the target 52 enters the space between the first front end 16a and the second front end 16b, and the movement of the hand 14 is stopped at the position where the target 52 blocks the first detection light L1 (S22, see FIG. 10B). The hand 14 is moved upward until the first detection light L1 is released from the target 52 (S23, see FIG. 10C). Consequently, the vertical positional relationship of the hand 14 with respect to the jig 50 can be specified. Subsequently, the hand 14 is lowered such that the second light emitting element 31 is located below the reflector 54 of the jig 50 by a predetermined distance (S24, see FIG. 10C). The predetermined distance is a value corresponding to the gap G. That is, when the second detection light L2 emitted from the second light emitting element 31 reaches the reflector 54 through the light transmission window 53, the hand 14 is lowered to the position where the second light receiving element 32 can receive the second detection light L2.

Figure 10D:
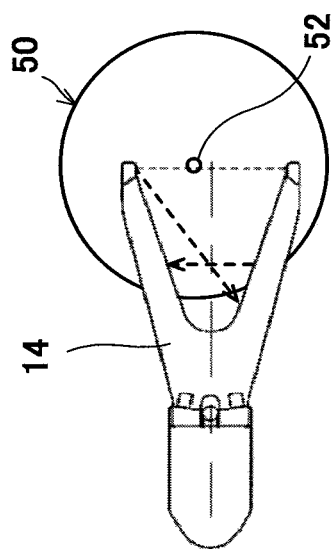

The target is scanned with the first detection light L1 and the second detection light L2 of the first and second sensors 20, 30 (S25), and the teaching position is acquired when the target 52 is located at the planar-view intersection point of the first detection light L1 and the second detection light L2 (S26, See FIG. 10D). When the target 52 is located at the planar-view intersection point, because the first detection light L1 is blocked by the target 52, the first light receiving element 22 cannot receive the first detection light L1, but the ON signal relating to the first sensor 20 is output from the amplifier 29 to the control device 40. The second detection light L2 is reflected by the reflector 54 (see FIG. 8B). Thus, the second light receiving element 32 receives the second detection light L2, and the OFF signal relating to the second sensor 30 is output from the amplifier 29 to the control device 40.

As described above, in the second embodiment, the second light emitting element 31 emits the second detection light L2 in the oblique direction having the vertically upward component, so that the second sensor 30 can act as the sensor that detects the presence or absence of the substrate S on the hand 14. The reflector 54 that reflects the second detection light L2 is provided in the target 52 similarly to the lower surface of the substrate S, so that the automatic teaching can be performed using the target 52 vertically provided on the jig 50. The center of the hand 14 can directly be acquired as the teaching position similarly to the first embodiment, so that the substrate S can certainly be placed.

Although the embodiments have been described, the configuration can be added, changed and/or deleted as appropriate within the scope of the present invention.

The first and second sensors 20, 30 are the transmission type optical sensor in the above embodiments, but may be constructed with a reflective type optical sensor.

The planar-view intersection point is set at the center of the hand 14 or the substrate center position at the time of holding the substrate in the above embodiment, but may be set at a predetermined position of the substrate except for the substrate center position at the time of holding the substrate.

What is claimed is:

1. A substrate transfer robot comprising:
    an arm having a degree of freedom in at least two horizontal axis directions;
    a hand including a base end connected to a front end of the arm and a first front end and a second front end that are bifurcated from the base end, a substrate being able to be held on an upper surface side of the hand;
    first and second sensors that emit detection light in a space between the first front end and the second front end and are arranged such that optical axes of the first and second sensors intersect each other within the space in planar view; and
    a control device that controls operation of the arm and the hand,
    wherein
    the first and second sensors are provided in the hand such that a planar-view intersection point of the optical axes is located on a predetermined position of the substrate when the substrate is held by the hand in planar view, and
    the control device
        operates the arm, scans a target placed at a teaching position with the first and second sensors, and
        acquires the teaching position when the target is located at the planar-view intersection point of the optical axes.

2. The substrate transfer robot according to claim 1, wherein
    each of the first and second sensors includes a light emitting element that emits detection light in a horizontal direction and a light receiving element that receives the detection light, and
    the control device determines that the target is located at the planar-view intersection point of the optical axes when the light receiving element of the first sensor cannot receive the detection light and when the light receiving element of the second sensor cannot receive the detection light.

3. The substrate transfer robot according to claim 1, wherein the predetermined position of the substrate is a center position of the substrate.

4. A method of automatically teaching a teaching position to a substrate transfer robot,
    the substrate transfer robot including:
        an arm having a degree of freedom in at least two horizontal axis directions;
        a hand including a base end connected to a front end of the arm and a first front end and a second front end that are bifurcated from the base end, a substrate being able to be held on an upper surface side of the hand;
        first and second sensors that emit detection light in a space between the first front end and the second front end and are arranged such that optical axes of the first and second sensors intersect each other within the space in planar view; and
        a control device that controls operation of the arm and the hand,
        the first and second sensors being provided in the hand such that a planar-view intersection point of the optical axes is located on a predetermined position of the substrate when the substrate is held by the hand in planar view, the method comprising:

a step of operating the arm, and scanning a target placed at a teaching position with the first and second sensors; and a step of acquiring the teaching position when the target is located at the planar-view intersection point of the optical axes.

5. A substrate transfer robot comprising:

an arm having a degree of freedom in at least two horizontal axis directions;

a hand including a base end connected to a front end of the arm and a first front end and a second front end that are bifurcated from the base end, a substrate being able to be held on an upper surface side of the hand;

first and second sensors that emit detection light in a space between the first front end and the second front end and are arranged such that optical axes of the first and second sensors intersect each other within the space in planar view; and a control device that controls operation of the arm and the hand, wherein the first and second sensors are provided in the hand such that a planar-view intersection point of the optical axes is located on a predetermined position of the substrate when the substrate is held by the hand in planar view, the first sensor includes a first light emitting element that emits detection light in a horizontal direction and a first light receiving element that receives the detection light, the second sensor includes a second light emitting element and a second light receiving element, one of the second light emitting element and the second light receiving element being disposed on the first front end and the other of the second light emitting element and the second light receiving element being disposed on the second front end, the second light emitting element emitting the detection light in an oblique direction having a vertically upward component, a target placed at a teaching position includes a reflector that reflects the detection light of the second sensor toward the second light receiving element when the target is located at the planar-view intersection point of the optical axes, and the control device operates the arm, scans the target with the first and second sensors, acquires the teaching position when the target is located at the planar-view intersection point of the optical axes, and determines that the target is located at the planar-view intersection point of the optical axes when the first light receiving element of the first sensor cannot receive the detection light but when the second light receiving element of the second sensor receives the detection light.

\* \* \* \* \*